United States Patent [19]

Moss

[11] Patent Number: 4,988,151
[45] Date of Patent: Jan. 29, 1991

[54] METHOD FOR MAKING EDGE FADED HOLOGRAMS

[75] Inventor: Gaylord E. Moss, Marina del Rey, Calif.

[73] Assignee: Hughes Aircraft Company, Los Angeles, Calif.

[21] Appl. No.: 401,310

[22] Filed: Aug. 31, 1989

[51] Int. Cl.$^5$ .................. G03H 1/04; G03H 1/28; G03H 1/06
[52] U.S. Cl. .................. 350/3.66; 350/3.77; 350/3.83; 350/320
[58] Field of Search .................. 350/3.6, 3.66, 3.67, 350/3.69, 3.74, 3.81, 3.83, 162.24, 320, 3.77

[56] References Cited

U.S. PATENT DOCUMENTS

| | | | |
|---|---|---|---|
| 3,483,513 | 12/1969 | Burckhardt et al. | 350/3.77 |
| 3,537,854 | 11/1970 | Grobin, Jr. et al. | 350/3.77 |
| 3,760,344 | 9/1973 | Hildebrand | 350/3.66 |
| 3,819,248 | 6/1974 | Takeda et al. | 350/3.81 |
| 4,130,348 | 12/1978 | Minami | 350/3.81 |
| 4,155,630 | 5/1979 | Ih | 350/3.77 |
| 4,206,965 | 6/1980 | McGrew | 350/3.66 |
| 4,458,978 | 7/1984 | Arns et al. | 350/3.67 |
| 4,818,045 | 4/1989 | Chang | 350/3.81 |

Primary Examiner—Bruce Y. Arnold
Assistant Examiner—Martin Lerner
Attorney, Agent, or Firm—Leonard A. Alkov; Wanda K. Denson-Low

[57] ABSTRACT

A method of making edge-faded holograms. A holographic recording medium is masked to provide a medium having photo-sensitive and photo-desensitized pixel areas. The photosensitive areas of the masked recording medium are exposed with a holographic image, producing an edge-faded hologram. Both positive and negative image masks may be employed to implement the invention. In a specific embodiment of the invention, the number and/or density of the photo-desensitized pixel areas are arranged in a pattern with the number of desensitized pixel areas increasing with proximity to the edge of the medium. The method may be performed in a single frame procedure or may be performed as a continuous process utilizing a continuous strip of holographic recording medium.

13 Claims, 2 Drawing Sheets

METHOD FOR MAKING EDGE FADED HOLOGRAMS

BACKGROUND

The present invention generally relates to holograms, and more particularly to a method for producing a hologram in which portions of the hologram adjacent to the edges are progressively reduced in definition to provide a hologram wherein the line of demarcation between the hologram and surrounding areas is not clearly visible.

Holograms are now a well known scientific development. Briefly, a hologram is a medium exposed by means of coherent light and processed such that the medium, when subsequently and appropriately illuminated by one of the two beams used to form the hologram, will generate a reflected or transmitted wavefront identical to the other of the two beams that was used to form the hologram. This second generated beam may be an image that appears in space or it may be a transformation of the first beam similar to that produced by a conventional lens or mirror. Because a hologram produces light wavefronts, the structure of the hologram reproducing surface involves control of dimensions on the order of fractional wavelengths of light. Control of these dimensions is difficult and requires extreme precision.

Both types of holograms have found applications in head up displays in which information from various instruments appears to float at a point in space in front of an operator, such as a pilot or operator of a motor vehicle. This enables the pilot or operator to observe the information without looking at the instrumentation and without the need to continuously refocus his or her eyes from objects in their normal field of view.

It has been found desirable to reduce or eliminate any clearly visible line of demarcation between the projection area of the holographic display and the surrounding viewing area. To this end, it has been proposed to progressively reduce the holographic grating efficiency at the edges of the hologram, and such holograms are known as edge-faded holograms. Previous methods for fading the holographic efficiency have attempted to spatially modify the holographic exposure and/or the hologram processing parameters to vary the diffraction efficiency over the hologram surface. However, currently known holographic recording materials are so nonlinear and variable that repeatability using such methods is very difficult to achieve.

Further, any variation in the process that changes the efficiency of the hologram also changes the peak wavelength and bandwidth of the hologram, and produces an unacceptable result for most applications. In another approach to resolve the problem, attempts to modify the efficiency of the hologram by changing laser exposure parameters involves complex scanning hardware and software that must be redone for each configuration. This method often requires extensive experimentation to achieve specific recording material characteristics. Reproducibility and yield with all previous methods is low.

There therefore has been a need for an effective and controllable method for producing an edge-faded hologram.

SUMMARY OF THE INVENTION

Broadly, the invention is a method for making edge-faded holograms. In accordance with the method, a frame of holographic material is masked to define a multiplicity of photosensitive and photo-desensitized pixel areas. The holographic material is then holographically exposed to form a hologram only on the photosensitive pixel areas. In one specific embodiment of the invention, the number and/or density of the photo-desensitized pixel areas are varied so that the proportion of desensitized pixel areas increases with proximity to the edge of the frame. In another specific embodiment, the density of the pixel areas is kept constant, however, the size of the desensitized area of each pixel is increased with proximity to the edge of the hologram frame.

The masking step may be performed with a positive mask which overlays the recording medium such that opaque areas of the mask prevent holographic exposure of pixel areas. Alternatively, a negative mask may be used and the recording medium is exposed with a source of non-hologram-forming light, such as incoherent or swept wavelength light, to fully expose and desensitize selected pixel areas prior to holographic exposure of the remaining pixel areas. The method may be performed in a single frame procedure or may be performed as a continuous process utilizing a continuous band of holographic recording medium.

It is therefore a feature of the invention to provide an improved method for producing edge-faded holograms. It is another feature of the invention to provide a method wherein a mask is utilized to produce photosensitive and photo-desensitized pixel areas on the holographic recording medium prior to holographic exposure thereof. Still another feature of the invention is to provide a method in which the photosensitive and photo-desensitized areas are formed in a pattern with the number of the photo-desensitized pixel areas increasing with proximity to the edge of the hologram frame. Still another feature of the invention is to provide a method in which the density of pixels is unchanged, but in which the desensitized area of each pixel increases with proximity to the edge of the hologram frame. Yet another feature of the invention is to provide a method which uses either positive or negative masking of the recording medium to provide the photosensitive and photo-desensitized pixel areas. Another feature of the invention is to provide a method that may be performed on single frame holograms or in a continuous mass production process.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
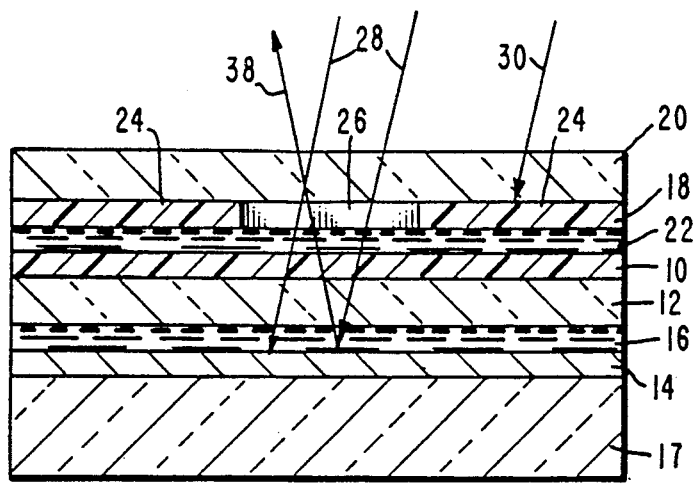
FIG. 1 illustrates a method of the present invention utilizing a positive contact mask.

Referring first to FIG. 1, there is shown a diagram useful in explaining a first embodiment of the invention. A sheet or film of holographic recording material 10 is typically bonded to a supporting substrate 12. The material 10 is a photo sensitive material, that is, a material that can be activated and subsequently processed upon exposure to light. Typical of such materials 10 are dichromated gelatin, silver halide, and optical photopolymers, for example.

Both the recording material 10 and supporting substrate 12 are transparent and are supported above the surface of a reflecting mirror or a master hologram 14. A refractive index matching fluid 16 is interposed between the recording substrate 12 and master hologram 14 to match the refractive index of the various layers and thereby ensure propagation of light through the layers without offset or reflections which would be caused by an airgap's different refractive index. The master hologram 14 is in turn secured to a supporting master hologram substrate 17. In accordance with the invention, a contact mask 18 overlays the holographic recording material 10, the mask 18 also being supported by a transparent mask substrate 20. A suitable refractive index matching fluid 22 is interposed between the mask 18 and the holographic recording material 10 to fill any air gap. The mask 18 is provided with a multiplicity of areas herein denominated pixel areas, some of which are opaque areas 24 and some of which are transparent areas 26. The transparent areas 26 may be either spaces filled with index matching fluid or transparent volumes of the same material as the substrate 12.

With this arrangement, a hologram is formed on the holographic recording material 10 by means of a coherent light beam or laser beam indicated by rays 28. The desired hologram is generated by the rays 28, forming an interference pattern with rays 38 which reflect from the mirror surface or diffract from the master hologram surface 14. Alternatively, the hologram may be produced in a conventional manner with two separate beams, one being reflected from a hologram subject and the other being a reference beam directed onto the recording material 10 directly from the laser source. Those rays 28 which impinge upon the mask 18 transparent pixel areas 26 will be transmitted through the mask 18 to produce a hologram in the pixel areas in registry with the transparent mask areas 26. Alternatively, laser light rays 30 which impinge upon opaque areas 24 of the mask 18 will be blocked by the mask 18 and no holographic image will be recorded in the recording material 10 corresponding to those pixel areas.

Figure 2:
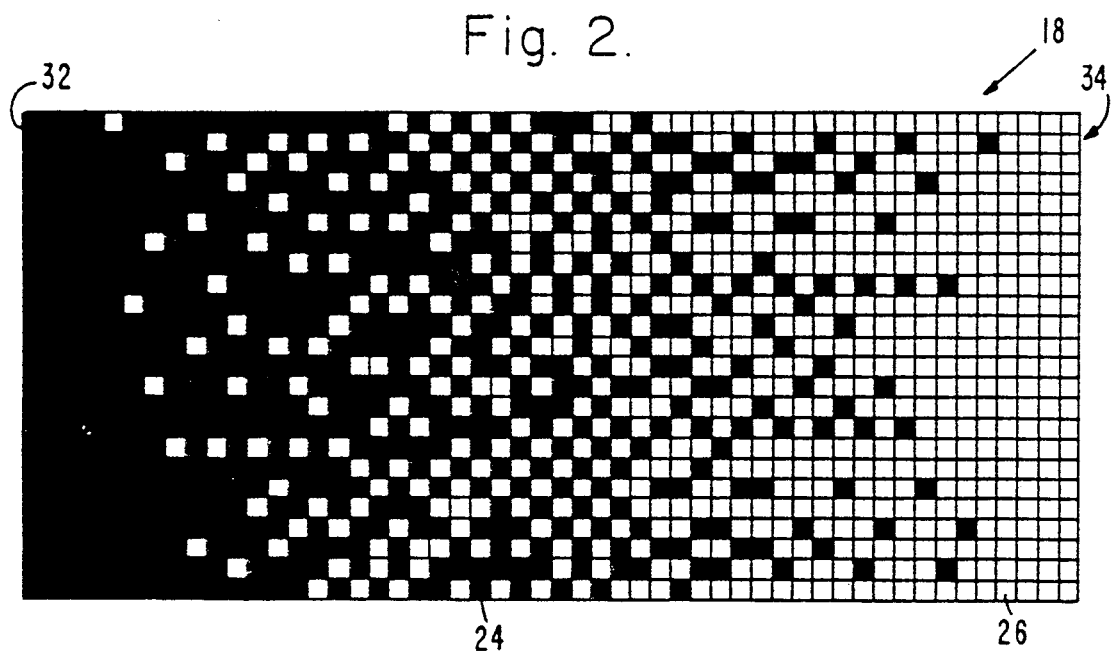
FIG. 2 illustrates a portion of a typical positive mask for use in the method of FIG. 1.

Referring to FIG. 2, a typical portion of the mask 18 is shown in plan view. The edge of the hologram corresponds to the mask edge 32 while the portion 34 of the mask 18 overlays a central portion of the hologram to be produced. From FIG. 2 it will be seen that the pixel areas 24, 26 are arranged in a rectangular matrix in which the proportion of opaque pixel areas 24 increases with proximity of the pixel areas to the edge 32. The portions of the mask overlaying the central portion of the hologram to be produced contain substantially all transparent pixel areas 26 while the pixel areas adjacent to the edge 32 of the hologram to be produced are substantially opaque.

It should now be apparent that by varying the proportion of opaque and transparent pixel areas 24, 26, the diffraction efficiency of the holographic image formed on the recording material 10 can be varied from near 100% to zero. The mask areas 24, 26 are made very small in size such that they cannot be individually resolved by the human eye. This produces progressive reduction of diffraction efficiency toward the edge of the holographic image. This in turn will produce a hologram in which a clear line of demarcation is not perceptible to the human eye between the bright holographic image area and the area with no image.

It should further be apparent that the rate of this fading effect can be precisely and easily controlled by simply varying the ratio of the opaque and the transparent mask areas 24, 26. Spatial variations of the holographic recording such as by varying the intensity of the recording rays 28, 30, or variations in chemically processing the hologram are not necessary. Accordingly, edge-fading of the hologram may be produced without any detrimental effect caused by the difficulty of spatially varying the holographic recording parameters thereby substantially simplifying production and ensuring improved hologram performance.

Figure 3:
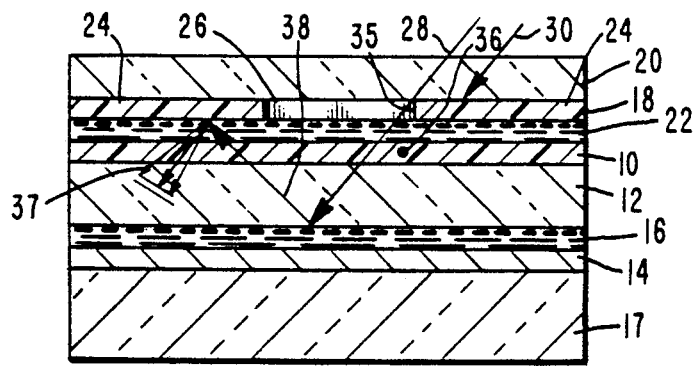
FIG. 3 illustrates the detrimental effects of mask shadows and reflections.

Referring now to FIG. 3, there is illustrated a detrimental side effect that can occur in the process illustrated in FIGS. 1 and 2 when the recording rays 28, 30 impinge upon the mask 18 at a significant angle. It should be noted that in general, the laser light ray 28 which exposes a hologram is slanted at an angle to the substrate 12 and recording medium 10 to enable setting the fringe spacing and to vary the reconstruction wavelength from that of the exposing laser. However, sharply slanted rays 28 are both shadowed and reflected by the mask 18 so that the hologram produced does not match the masked pattern, and furthermore may contain spurious holograms. For example, ray 30 is blocked by the pixel area edge 35 of the mask 18 so that it does not expose the hologram recording material 10 at a point identified at 36. Further, the ray 38 is reflected from the under side of the mask 18 as indicated by rays 37 generating an unwanted hologram which will degrade the performance of the final element.

Figure 4:
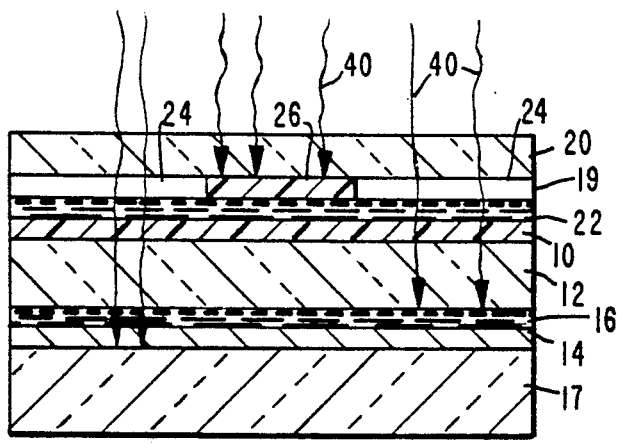
FIG. 4 illustrates a method of the present invention utilizing a negative mask and preexposure of the holographic recording medium to generate the required pattern of photosensitive and photo-desensitized pixel areas.

With reference now to FIG. 4, a solution to both the shadowing and reflection problems may be effected by desensitizing the recording medium 10 prior to holographic exposure in those pixel areas 24 where no hologram is wanted. This may be effected by preexposing the recording medium 10 with incoherent light, indicated by rays 40, which is incident upon a mask 19 and the recording medium 10 in a direction normal thereto. It will be recognized that the mask 19 is a negative of the mask 18 shown in FIG. 2 in which the transparent and opaque areas 24, 26 will be reversed from those of the mask 18. As an alternative to using incoherent light for this step, a laser beam or coherent light source may be used by moving the mirror or master hologram 14 during the preexposure step, thereby destroying the hologram in these areas and obviating subsequent exposure of these areas with a holographic image.

Figure 5:
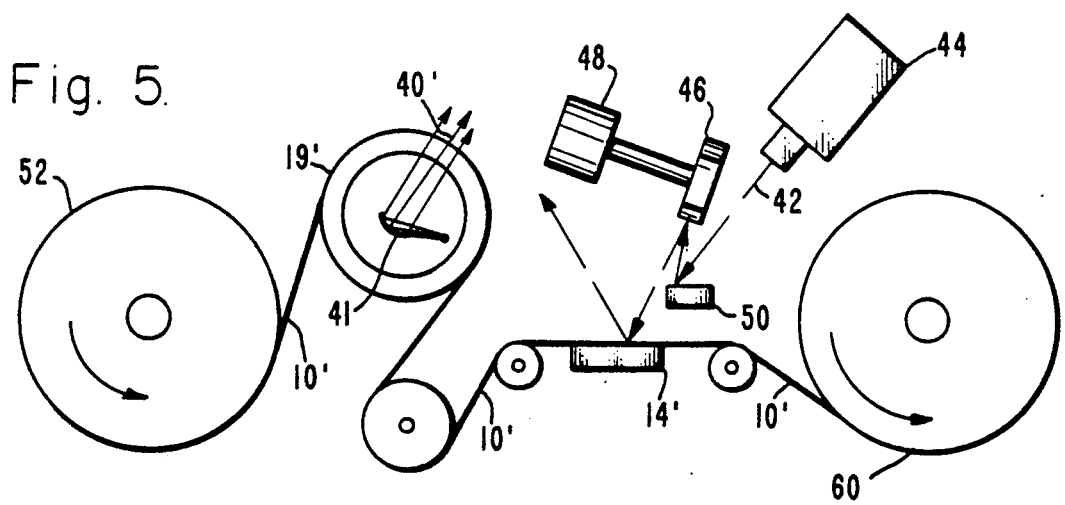
FIG. 5 illustrates the method of the present invention utilized in a continuous edge-faded holographic production system.

Referring now to FIG. 5, there is shown an application of the method of the present invention in a high volume production application. This embodiment is described in conjunction with the preexposure method as discussed in reference to FIG. 4. It will, however, be apparent that either the contact mask or preexposure variations of the method may be utilized. In the method as illustrated in FIG. 5, the hologram itself is formed by a scanned laser beam 42 generated by a means of a laser 44, and a scanning mirror 46 moved by a scan motor 48.

The scan laser beam 42 is reflected by fixed mirror 50 and scan mirror 46 onto the recording medium 10' which is herein provided in the form of a continuous moving sheet of recording medium provided by a feed roller 52. The recording medium 10' feeds from the feed roll 52, passes over a mask roll 19' which is in effect a mask such as illustrated in FIG. 4 but formed in a cylindrical configuration. Incoherent light 40' from a thermal or gas discharge source 41 passes through the mask 19' to effect the preexposure step. The recording medium 10' then travels past a single-axis scanned laser beam 42 as discussed above forming the holographic image in those pixel areas 26 for which the mask on the mask roll blocks the incoherent saturation exposure. If the hologram function is constant over its surface, the reflection mirror or master hologram 14 may be fixed in position. If, however, the recorded hologram function varies over its surface, the mirror or master hologram 14 must by moved along with the recording medium 10'. One means of implementing this movement is to form the mirror or master hologram 14 in a cylindrical shape and rotate it in the same fashion as the mask roller 19', for example. The recording medium 10' may then either be developed during its continuation to the take up roll 60 or can be stored for processing later. Continuous holographic films of the recording medium 10' that may be processed in a continuous manufacturing flow have been developed by companies such as Dupont, Polaroid, and Canon, for example. These materials include Polaroid DMP128 photopolymer, Dupont photopolymer and Canon photopolymer, for example.

From the above examples, it will be seen that the method of the present invention provides an effective easily controlled, production method for producing an edge-faded hologram. The edge-faded holograms produced are particularly valuable in applications such as head up displays wherein a clear line of demarcation between a holographic image and surrounding viewing areas is undesirable. It should further be apparent to those skilled in the art that the edge-faded hologram formation method of the present invention can be modified in various ways without departing from the scope of the invention. For example, in some cases it might be desirable to vary the pixel size, rather than the pixel density of the pixel areas of the mask. The preexposure mask may be provided as a moving flat section instead of a roller. The mask may be imaged onto the film with a suitable optical system rather than being provided as a real mask or contact mask. This enables the recording medium 10' to be embedded within the transparent structure. Also, the preexposure can be effected with a coherent source and the hologram smeared by wavelength shift or, as discussed above by moving the reflection surface.

Although the foregoing has described examples of fading the edge of reflection holograms only, it is clear that the same procedure of pre-exposing the mask pattern to saturation may also be used to fade the edge of transmission holograms. Other variations of the basic concept and method of the invention for fading the macroscopic diffraction efficiency while keeping the microscopic efficiency constant will become apparent to those skilled in the art in view of the above disclosure.

Thus there has been described a new and improved method of producing an edge-faded hologram. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of making edge-faded holograms comprising the steps of:
    desensitizing holographic medium exposure step comprising the sub-steps of:
    providing a mask having a predetermined pattern of adjacent opaque and transparent pixel areas,
    positioning the mask between the holographic medium and a source of incoherent light,
    exposing the medium through the mask to form a corresponding spatial pattern of photo-desensitized pixel areas corresponding to desired transparent pixel areas and photosensitive areas corresponding to desired recorded hologram areas, and
    recording the hologram with the mask removed; and
    exposing a holographic medium having edges with a spatial pattern of laser light to form a predetermined pattern of pixel areas in which some areas contain a holographic element and other areas are transparent.

2. The method of claim 1 wherein the spatial pattern of laser light is generated with a contact mask defining opaque areas and transparent areas that define the holographic areas.

3. The method of claim 2 further including the steps of:
    providing a medium in a continuous moving strip; and
    moving the strip in synchronization with moving the mask while simultaneously performing the desensitizing holographic medium exposure and exposing the holographic medium steps on successive portions of the strip.

4. The method of claim 2 further including the step of forming the opaque areas in a pattern, the number of opaque areas increasing in proportion to the proximity of the areas to the edge of the medium.

5. The method of claim 4 further including the steps of:
    providing a medium in a continuous moving strip; and
    moving the strip in synchronization with moving the mask while simultaneously performing the desensitizing holographic medium exposure and exposing the holographic medium steps on successive portions of the strip.

6. The method of claim 1 further comprising the step of:
    forming the opaque areas in a pattern such that the number of transparent areas increases in proportion to the proximity of the pixel areas to the edges of the medium.

7. The method of claim 6 further including the steps of:
    providing the recording medium in a continuous strip; and
    moving the strip, and performing the desensitizing holographic medium exposure and exposing the holographic medium steps on successive portions of the strip while it is moving.

8. The method of claim 1 wherein the desensitizing holographic medium exposure step comprises using a scanned or flood laser beam and further includes the steps of placing a mirror behind the recording medium and reflecting the scanned or flood laser beam onto the recording medium, while simultaneously moving the mirror to smear the recorded fringe pattern.

9. The method of claim 8 further including forming the opaque areas and transparent areas of the mask in a pattern, the number of opaque areas increasing as a function of the distance of the opaque areas from the edges of a frame positioning the holographic medium.

10. The method of claim 9 further including the steps of:
providing the recording medium in a continuous strip; and
moving the strip, and performing the desensitizing holographic medium exposure and exposing the holographic medium steps on successive portions of the strip while it is moving.

11. The method of claim 1 wherein the desensitizing holographic medium exposure step comprises using a scanned or flood laser beam and further includes the steps of placing a master hologram behind the recording medium and reflecting the scanned or flood laser beam onto the recording medium, while simultaneously moving a master hologram to smear the recorded fringe pattern.

12. The method of claim 11 further including forming the opaque areas and transparent areas of the mask in a pattern, the number of opaque areas increasing as a function of the distance of the opaque areas from the edges of a frame positioning the holographic medium.

13. The method of claim 1 further including the steps of:
providing a medium in a continuous moving strip; and
moving the strip in synchronization with moving the mask while simultaneously performing the desensitizing holographic medium exposure and exposing the holographic medium steps on successive portions of the strip.

* * * * *